Figure 1:
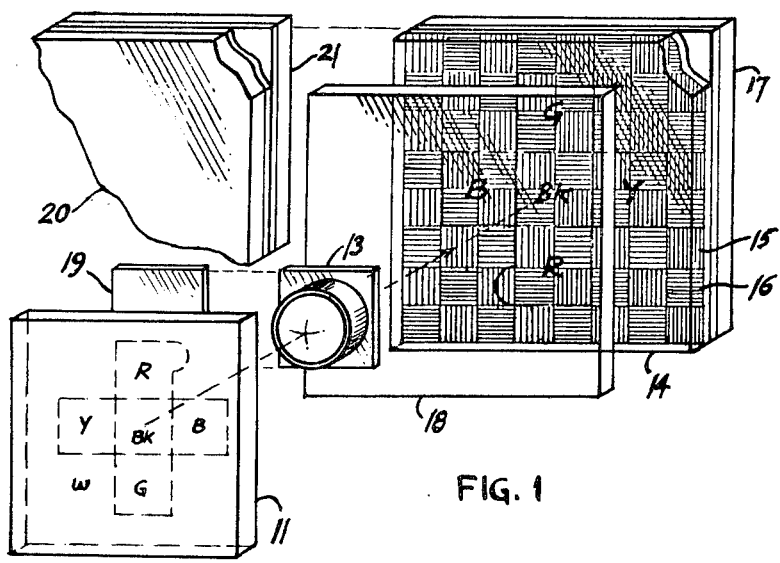

United States Patent [19]
Lorber

[11] 3,939,769
[45] Feb. 24, 1976

[54] PROCESS FOR REPRODUCING A FULL-COLOR PICTURE IN TWO IMPRESSIONS

[75] Inventor: Leslie H. Lorber, Boston, Mass.
[73] Assignee: Bernard Olcott, Weehawken, N.J.
[22] Filed: Aug. 13, 1973
[21] Appl. No.: 388,033

[52] U.S. Cl. .................... 101/211; 96/30; 101/450
[51] Int. Cl. ....................... B41m 1/20; B41m 3/00
[58] Field of Search ......................... 101/450–452, 101/211; 96/30–32

[56] References Cited
UNITED STATES PATENTS

| | | | |
|---|---|---|---|
| 565,891 | 8/1896 | Fravenfelder | 101/211 |
| 1,420,673 | 6/1922 | Warga | 101/211 |
| 1,940,931 | 12/1933 | Young | 101/211 |
| 3,034,890 | 5/1962 | Land | 96/30 X |
| 3,213,787 | 10/1965 | Miller | 101/211 |
| 3,381,612 | 5/1968 | Lecha | 101/211 X |
| 3,429,702 | 2/1969 | Lober | 101/211 |
| 3,752,072 | 8/1973 | Lober | 101/211 |
| 3,752,073 | 8/1973 | Lober | 101/211 |

FOREIGN PATENTS OR APPLICATIONS

| | | | |
|---|---|---|---|
| 10,399 | 1907 | United Kingdom | 101/211 |
| 1,228,878 | 4/1971 | United Kingdom | 101/211 |

OTHER PUBLICATIONS

"Multicolor Effects on Two–Color Presses," Dupont Magazine, Sept.–Oct. 1968, Vol. 62, No. 5 pp. 2–5.
"Inland Printer," Feb. 1931, p. 93.

*Primary Examiner*—Clyde I. Coughenour
*Attorney, Agent, or Firm*—Bernard Olcott

[57] ABSTRACT

Process for reproducing a full color picture in two printing impressions, comprising the steps of:

a. Projecting a multi-color image upon a first panchromatic type film through a composite separation screen having first areas which pass long record light rays and attenuate short record light rays and second areas which pass short record light rays and attenuate long record light rays;
b. Projecting such multi-color image upon an ortho type film;
c. Developing such first panchromatic type film and such ortho type film;
d. Forming a first printing plate by such developed first panchromatic type film;
e. Projecting long record light rays through such developed ortho type film and such composite separation screen upon a second panchromatic type film;
f. Removing such developed ortho type film and projecting short record light rays through such composite separation screen upon such second panchromatic type film;
g. Developing such second panchromatic type film;
h. Forming a second printing plate from such developed second panchromatic type film;
i. Inking a selected one of such printing plates with a first ink and transferring therefrom a first ink image upon a substrate; and
j. Inking the other of such printing plates with a second ink and transferring therefrom a second ink image upon such substrate in registration with such first ink image.

12 Claims, 15 Drawing Figures

U.S. Patent  Feb. 24, 1976  Sheet 1 of 3  3,939,769

FIG. 1-A

PROCESS FOR REPRODUCING A FULL-COLOR PICTURE IN TWO IMPRESSIONS

A full-color picture is here considered one which may have any combination of colors in flat and/or gradient tones.

An effective reproduction (of a full-color picture) is here considered to be one which appears to have all the colors of the original subject, without necessarily reproducing each exact shade of color, and which has good contrast and sharpness of detail presuming such qualities were present in the original subject.

Color is here considered a sensation commonly ascribed to surface, e.g., red, green, blue, yellow, orange, brown, purple, complex sensations such as flesh tones and metallic tones, the "achromatic" sensations white, gray and black, etc.

As identified by Edwin H. Land in *Scientific American*, May 1959, Pages 84, etc., "red" is a long record light ray phenomenon while "green" is a short record light ray phenomenon.

With reference to the accompanying Drawing, which is not in scale or in proportion, but strictly schematic, my invention may be practiced as follows:

Referring to FIG. 1, a full-color picture 11 to be reproduced is twice photographed — once onto panchromatic film 17 and once onto ortho film 21. Picture 11 is, for simplicity, assumed to only have the colors red (R), green (G), blue (B), yellow (Y) and black (B) arranged as a cross upon a white (W) background. The half-round protrustion in the red is provided, for reference, as an indication of lateral sense. The colors shown, also assumed to be fully saturated and of uniform flat tone, are "key" colors, in that an understanding of how they are reproduced on the printed page will assist in understanding the reproduction of other colors.

The photo made on pan film 17 is obtained through a crossline halftone screen 18 and through a 2-color contact screen 14. The 2-color screen has interspersed on its face "red" and "green" filter elements 15 and 16. Preferably, the "red" screen elements are slightly larger in area, e.g., about 10% larger, than the "green" screen elements. This is more clearly shown in FIG. 1-A, and a similar pattern should be understood in FIGS. 13 and 14 wherein, for convenience, a simple checkerboard pattern is depicted. Acceptable results will obtain if the "red" and "green" elements are substantially pure red and green, or if only one or the other set of elements is of a substantially pure red or pure green. Preferably, however, both screen elements should transmit a minor amount of blue, e.g., not more than about 15% blue. As a convenience in practice here assumed, the "red" elements are full magenta and the "green" elements are full cyan, and the 2-color screen is used conjunctively with a yellow filter 13 of about 85–95% purity. (A yellow density of about 85% is hereinafter assumed for filter 13.) Various alternative patterns will be obvious, and various means of manufacture, and the filter factors of "red" and "green" elements may be equalized by the addition of neutral density to a selected one set thereof. The screen 14 preferably has a thin dimensionally stable base, e.g., 4-mil "Estar" polyester. Assuming same-size reproduction is intended, as for a magazine or book, the 2-color screen pattern can be relatively coarse, e.g., about 30 of each element per linear inch (about 60 in all), as the pattern will become largely obscured in the final print.

The halftone screen 18 is suitably of a cross-line type positioned slightly in front of the film 17. Its ruling is best at least twice as fine, or at least one-third coarser, than the interval between successive colors in the 2-color screen, a relatively fine screen being generally preferred, and it should be angled or oriented to produce minimal or no interference effects with the 2-color screen. The use of "direct" halftoning, as here assumed, is largely a descriptive convenience, and practice is not limited thereto.

Figure 2:
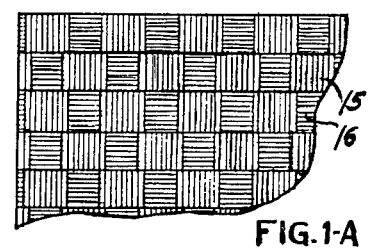
Figure 2:
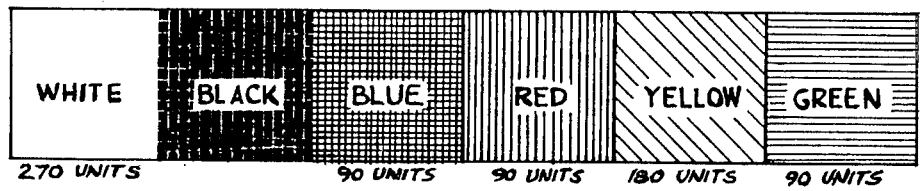
Figure 3:
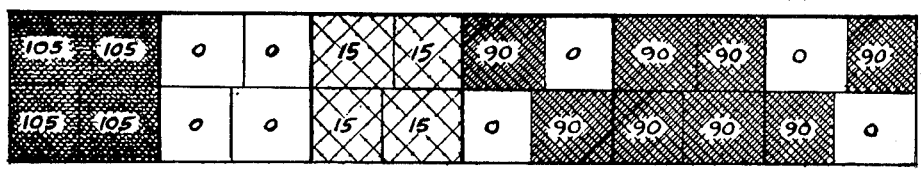

FIG. 3 depicts developed negative density on film 17 for selected picture colors, (here assuming direct halftoning was not employed). The corresponding picture colors are shown immediately above, in FIG. 2. For each color, the upper left and lower right quadrants show density obtained through "red" filter elements 15, while the upper right and lower left quadrants show density obtained through "green" filter elements 16. An area encompassing two conjugate pairs of screen filter elements is the normal "unit" of color resolution, but in practice a color imaging minimally upon co-joining portions of two adjacent screen filter elements can be reproduced. Accordingly, there will, in practice, be an effective unit of color resolution smaller than the normal unit, though of indeterminate size. Numeric values in FIG. 2 represent assumed relative actinic potential of each color. Numeric values in FIG. 3 represent densities relative to a "full" density of 100, and presume about 15% blue transmission through both "red" and "green" filter elements. A correct exposure is best determined when a sample yellow produces an average negative density of about 90–95% full density. This will normally cause a slight degree of overexposure of density representing white. In a continuous-tone exposure, such as here presumed, this slight overexposure would serve to eliminate formation of highlight halftone dots in subsequent halftoning; however if direct halftoning is used, such as in FIG. 1, "flashing" or other technique may be employed to directly prevent formation of such dots. Though permissible, highlight halftone dots in this "composite color separation" are not desired.

It should be noted, in FIG. 3, that blue is differently represented than black. This would not occur except for the small amount of blue transmission through both screen filter elements, together with the prescribed correct exposure. The conjugate pairs of densities here shown equal may, in practice, differ slightly, as may the values of all densities relative to each other. It is also as a consequence of exposure so that yellow produces about 90–95% average density, that the maximum density is less than full in quadrants of red and blue units. These various densities will, of course, be reciprocally represented in a positive equivalent of this image.

Figure 8:
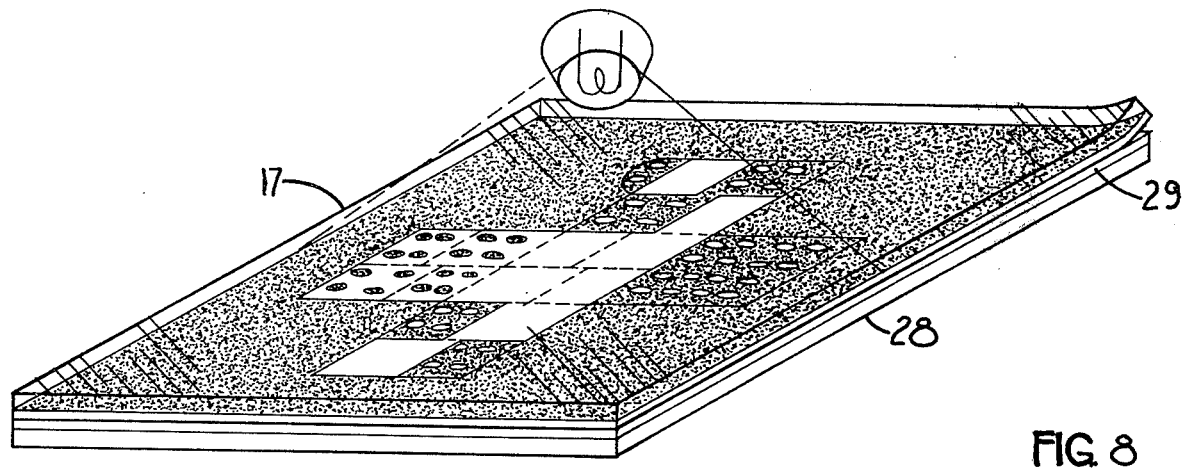

As shown in FIG. 8, the halftone (composite color separation) image on film 17 is printed down onto a common lithographic plate 28, e.g., having a sensitized coating 29 which is rendered insoluble-hydrophobic-oleophilic by light.

Figure 9:
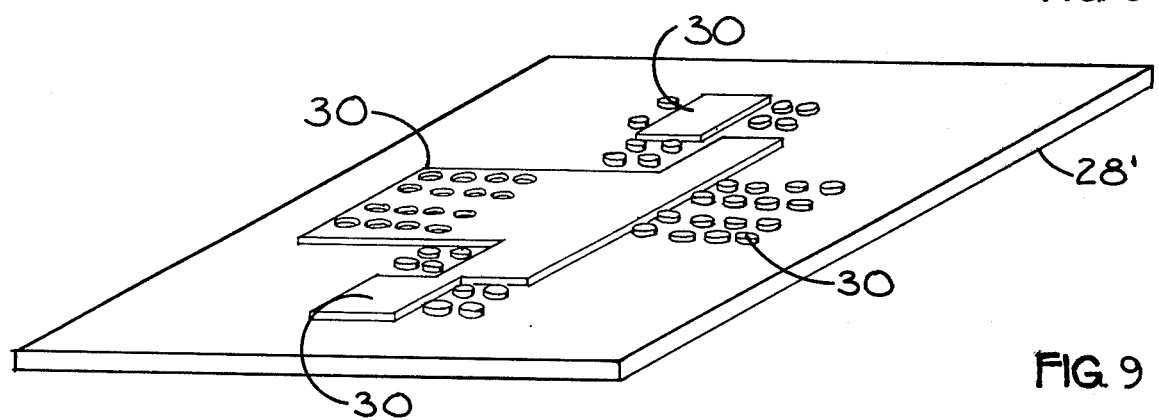

The developed lithographic plate 28', is shown in FIG. 9, and has an ink-receptive halftone image 30 corresponding to that on film 17, but of positive sense. Plate 28' is herein known as the "1st" plate, and image 30 as the "1st-plate image".

Referring back to FIG. 1, the photo made on ortho film 21 is, for convenience, directly halftoned through a contact screen 20. If desired, a crossline screen or auto-screen ortho film could be used for direct halftoning, or halftoning could be done at a later stage. The screen ruling may be similar to that of the screen used to halftone the image on film 17, but the screen 20 should be angled differently from the screen 18. (No 2-color screen is used for this photograph.) Assuming the ortho film 21 to have substantially equal green and blue sensitivity, a pale yellow filter 19 is preferably inserted into the optical path, and attenuates blues slightly. This provides a desired imbalance. It is also acceptable to slightly attenuate green rather than blue, as by use of a pale magenta filter. The attenuated light component may suitably be about 85–95% the strength of the unattenuated component. Such recommended practice is not meant to exclude use of ortho film or equivalent without supplemental use of light balancing means.

What is essentially desired by the above procedure is a "cyan" color separation. In a "cyan" separation saturated blue and green will each be represented by density of generally middle value, which is distinct from how such colors would be represented in a positive print made from a conventional red color separation, often known as a "minus-red", i.e., cyan, print. Accordingly, in a positive print made from the "cyan" separation on film 21, densities which are reciprocal to those on film 21 will represent minus-"cyan", but will be distinct from densities obtained in a red color separation. The exposure on film 21 is preferably just sufficient to leave about 8–10% highlight "windows" in density representing picture white.

Figure 4:

FIG. 4 depicts developed negative density of film 21, (here assuming direct halftoning was not employed). Corresponding picture colors are shown above, in FIG. 2. It will be noted that both yellow and green are represented by slightly more than 50% density and blue by slightly less than 50% density. These relative values presume that the blue component of the "cyan" was attenuated to about 85% the strength of the green component by the pale yellow filter 19. Also to be noted is the absence of density in units representing black and red, and the almost full density in the unit representing picture white.

Figure 12:
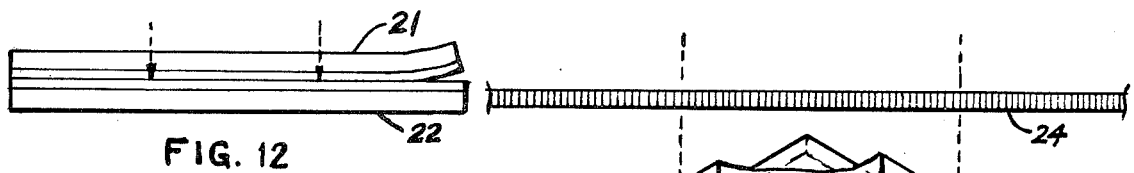

As shown in FIG. 12, the developed halftone "cyan" separation on film 21 is printed onto copy film 22. The image on film 22 will be a corresponding positive, laterally correct.

Figure 13:
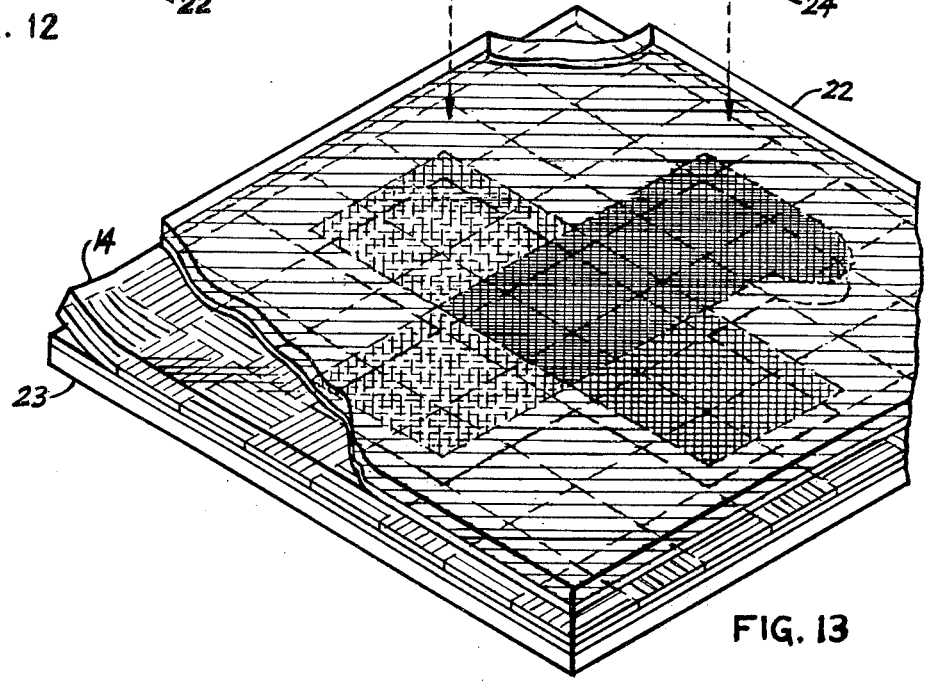

Next, as shown in FIG. 13, the image on film 22 is printed by red light, e.g., as passes through a red filter 24, and through the same 2-color screen 14 which was used in FIG. 1, onto panchromatic film 23. The film 22 may be face-down upon the base of screen 14, assuming the latter to have the thin base recommended. Screen 14 must here have similar register to the image passing through it as it had in FIG. 1. By this procedure, "green" screen filter elements will block passage of incident red light so that the negative halftone print on film 23 is regularly interrupted or blanked. Because of the prescribed register, the interruptions will occur only in parts of the "cyan" image which positionally correspond to parts of the composite color separation (on film 17) which formed through "green" filter elements 16. Film 23 is not yet removed or developed.

Figure 14:
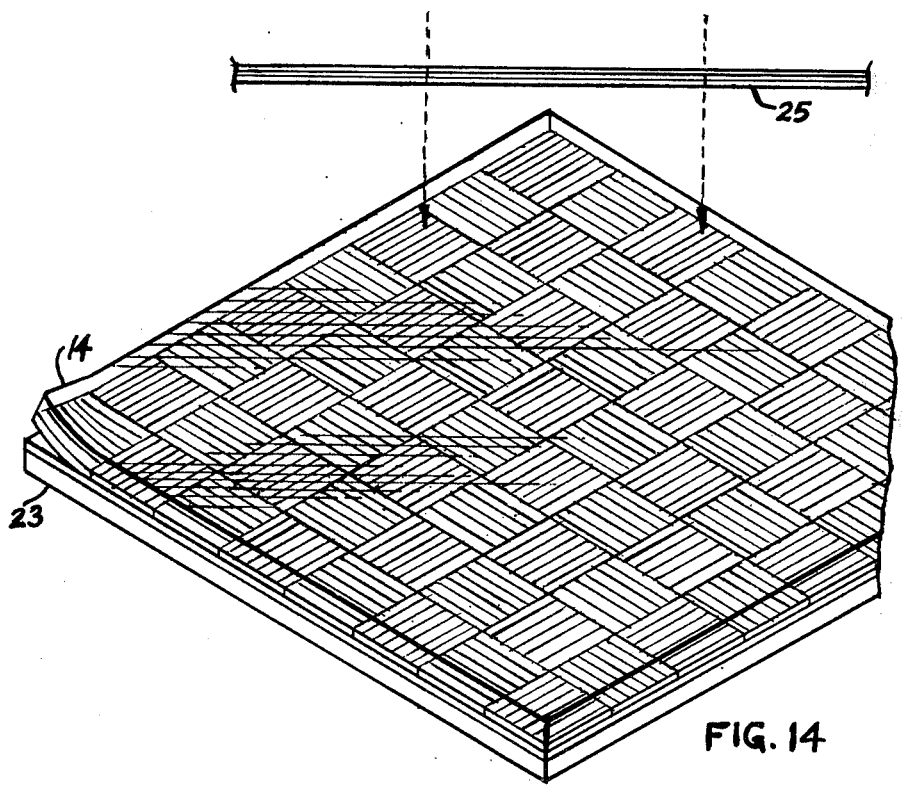

As shown in FIG. 14, film 22 is removed and a green filter 25 is substituted for red filter 24, then film 23 is exposed again. This second exposure will produce uniform density on film 23 in parts underlying "green" filter elements 16 of the 2-color scrren, which parts were previously unexposed and blank. Film 23 may now be developed. The image thereon is still considered to be interrupted, but by areas of uniform density.

Figure 10:
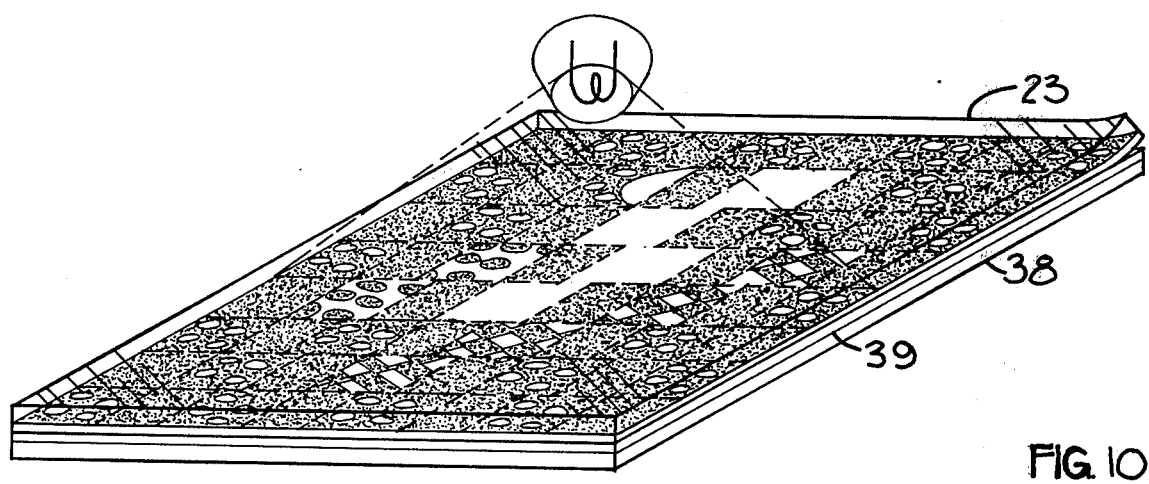

Referring to FIG. 10, the image on film 23 is printed down onto a second lithographic plate 38, e.g., having a sensitized coating 39 which is rendered insoluble-hydrophobic-oleophilic by light.

Figure 11:
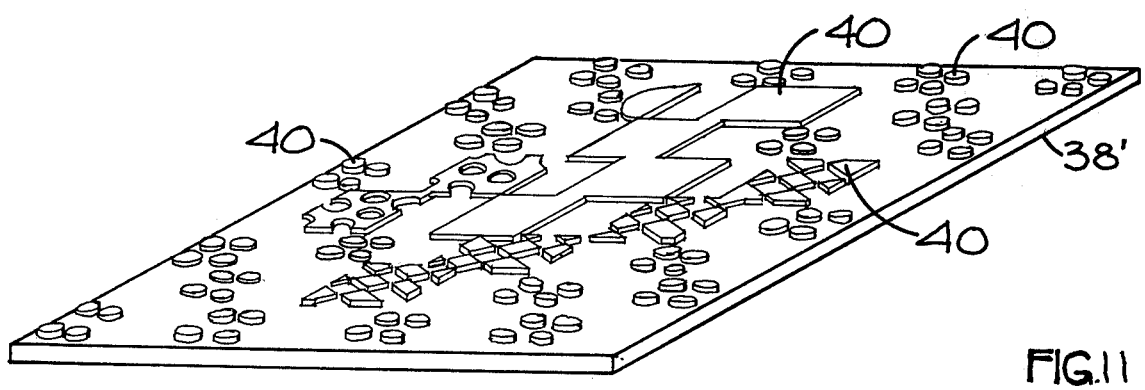

The developed second lithographic plate 38' is shown in FIG. 11, and has an ink-receptive halftone image 40 corresponding to that on film 21 except that it is of positive sense and interrupted. Plate 38' is herein known as the "2nd" plate although it may be used first, and image 40 is known as the "2nd-plate image".

In use, it is essential that the 1st plate, 28', be inked with (lithographic) ink of a black tone, and that the 2nd plate, 38', be inked with (lithographic) ink of a red color. Preferably, the black tone is blue-black or purple-black, and the red color is a bright red.

Figure 5:
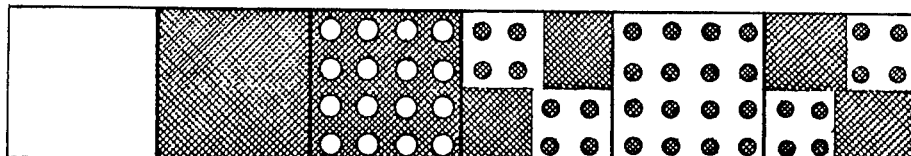

If the 1st plate 28' is dampened, rolled up with litho ink of black tone, then offset onto white paper, the paper will bear an image corresponding to the 1st-plate image 30. Units of the print representing the particular picture colors shown in FIG. 2 would appear as in FIG. 5. It will be notes, in FIG. 5, that highlight halftone dots are absent from white picture areas, that solid toned-black halftone density represents black, that about 85% toned-black halftone density represents blue, and that about 10% toned-black halftone density represents yellow. Also, that red and green are each represented by conjugate pairs of hlaftone densities, in each case one pair having low density and the other pair having full density, and that the area-size of conjugate pairs differs slightly. Being a positive image, some halftone densities (those reciprocal to negative densities formed through "red" screen elements) will represent minus-"red" amounts in the picture, and other halftone densities (those reciprocal to negative densities formed through "green" screen elements) will represent minus-"green" amounts in the picture.

Figure 6:
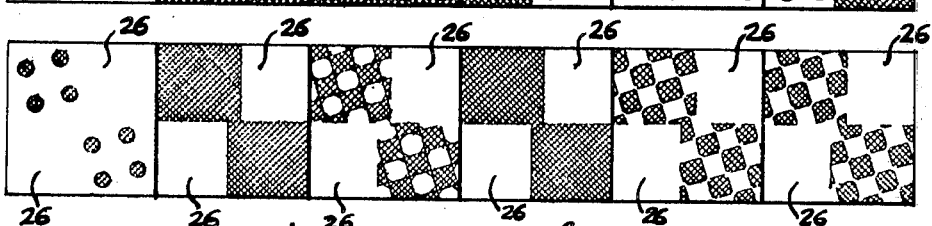

If the 2nd plate 38' is dampened, rolled up with litho ink of red color, then offset onto white paper, the paper will bear an ink image corresponding to the 2nd-plate image 40. Units of the print representing the particular picture colors shown in FIG. 2 would appear as in FIG. 6. As may be seen in FIG. 6, red highlight halftone dots (about 10% size) appear in white picture areas, and full red halftone density appears in both black and red picture areas, while slightly more than 50% red halftone density appears in blue picture areas, further, that slightly less than 50% red halftone density appears in yellow and green picture areas. It should also be noted that the preceding halftone values appear only in two predetermined quadrants of each unit representing a picture color. Remaining quadrants 26 are absent of density. This is a consequence of the blanking hereinbefore described. To be appreciated, is that these positive halftone values properly represent amounts of minus-"cyan" in the picture (which component includes, but is not exclusively, the red component), and will be rendered in a red ink.

In normal practice, the 1st plate 28' and the 2nd plate 38' may be mounted on a conventional 2-color rotary offset press, e.g., comprising two single-color offset presses in series. The 2nd plate is disposed to be the first to print and the 1st plate is disposed to be the second to print, and the respective images thereon are imposed in pictorial register with each other upon a substrate. The 1st plate is inked with a black tone ink, and the 2nd plate is inked with ink of a red color. By such practice the black-tone ink will overprint the red ink. The red ink is therefore preferably of a kind which will set prior to the impression of the black-tone ink, e.g., of a pressure-set kind, so not to redden the black-tone ink. The substrate may be white or an off-white. Preferably it is a pale green (about 5–8% tint of green).

Figure 7:
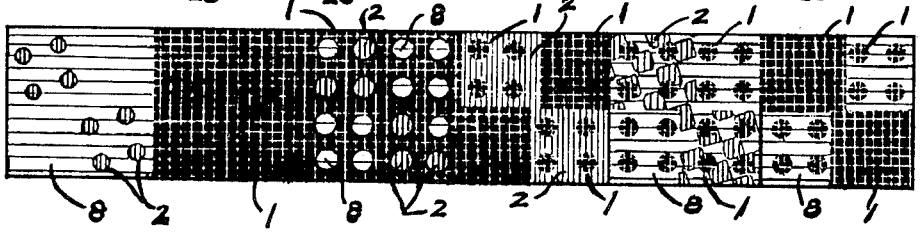

In a complete reproduction made as above described, white, black, blue, red, yellow and green would be represented as in FIG. 7. (No colors will be observed from the Drawing.) The 1st-plate image, printed in black-tone ink 1, has obscured parts of the 2nd-plate image, printed in a red ink 2. It may not be evident how such representation gives rise to correct colors in each instance, nor how other colors are produced.

Without entering into extensive theoretical analysis, a full range of perceived colors, of good constancy and industinguishable from "real" colors, is principally due to phenomena discovered by Edwin H. Land, as reported in *Scientific American*, May, 1959 pages 84, etc. in Fortune, May, 1959, also to such known effects as simultaneous contrast, and possibly in part to classical 3-color theory (if the black ink has a blue quantity). The instant print will be more effective than any red-black synthesis of full-color herebefore known, other than a print made as described in my U.S. Pat. No. 3,752,072 entitled "Process for Reproducing a Full-Color Picture in One Impression".

Described photographic procedures were merely exemplary, and equivalent negative images for plate-making can be obtained by other ways and with other means. For example: a composite color separation can be made from separate "red" and "green" color separations rather than by direct photography; instead of the 2-color screen a compositing screen could be used which has interspersed oppositely aligned (polarized) analyzing elements, conjunctive with general polarizing filters and general "red" and "green" color filters; compositing may be affected by step-repeat operations using a patterned light stencil. The need for separate exposures, as described relative to FIGS. 13 and 14, is not essential for production of an equivalent interrupted film image. Where platemaking may require use of positive images, necessary minor modifications will be understood.

Although this invention has been described as practiced with lithographic plates and offset lithography, the prescribed 1st-plate image and 2nd-plate image may be equivalently formed upon other printing surfaces and printed by other processes. In some such instances, e.g., xerography, electronography, gravure and collotype, halftoning may not be necessary. Suitable and equivalent images can be formed wholly by mechanical means, as on molded duplicate relief plates, or on relief plates prepared by a mechanical engraving machine, and on zerographic printing surfaces or other photoconductive printing surfaces, prescribed images may be directly formed by electro-optical means. In all such cases where photomechanical plate preparation is avoided, color separation and compositing may be affected optically instead of photographically.

In lithography and other so-called "chemical" printing processes, provided that the black-tone ink is of a composition which will be repellant to subsequently printed red ink, the 1st plate may suitably be the first in series on the press.

Having described my invention both explicitly and generally, it comprises all practice within the scope of my claims.

What I claim is:

1. Process for reproducing a full color picture in two printing impressions, comprising the steps of:
    a. Projecting a multi-color image upon a first panchromatic type film through a composite separation screen having first areas which pass long record light rays and attenuate short record light rays and second areas which pass short record light rays and attenuate long record light rays;
    b. Projecting said multi-color image upon an ortho type film;
    c. Developing said first panchromatic type film and said ortho type film;
    d. Forming a first printing plate by said developed first panchromatic type film;
    e. Projecting long record light rays through said developed ortho type film and said composite separation screen upon a second panchromatic type film;
    f. Removing said developed ortho type film and projecting short record light rays through said composite separation screen upon said second panchromatic type film;
    g. Developing said second panchromatic type film;
    h. Forming a second printing plate from said developed second panchromatic type film;
    i. Inking a selected one of said printing plates with a first ink and transferring therefrom a first ink image upon a substrate; and
    j. Inking the other of said printing plates with a second ink and transferring therefrom a second ink image upon said substrate in registration with said first ink image.

2. Process according to claim 1 wherein said first areas of said composite separation screen, said long record light rays, and said first ink are of selected red tones and said second areas of said composite separation screen and said short record light rays are of selected green tones.

3. Process according to claim 2 wherein the red tone includes a minor blue component.

4. Process according to claim 2 wherein the green tone includes a minor blue component.

5. Process according to claim 2 wherein the ink of selected black tone is blue-black.

6. Process according to claim 2 wherein the ink of selected black tone is purple-black.

7. Process according to claim 2 wherein the ink of selected red color is bright red.

8. Process according to claim 2 wherein said second ink is of a selected black tone and is applied to said first printing plate.

9. Process according to claim 8 wherein said red tone ink image is transferred onto said substrate before said black tone ink image is transferred upon said substrate and said substrate is substantially white.

10. Process according to claim 9 wherein the substrate of substantially white color has a pale green tint.

11. Process according to claim 8 wherein said multi-color image is projected upon said first panchromatic type film and said ortho type film through selected yellow filters.

12. Process according to claim 2 wherein said first areas of said composite separation screen are magenta and said second areas of said composite separation screen are cyan and said multi-color image is projected upon said first panchromatic type film and said ortho type film through selected yellow filters.

* * * * *